(12) United States Patent
Tien et al.

(10) Patent No.: US 11,329,216 B2
(45) Date of Patent: May 10, 2022

(54) MAGNETIC TUNNEL JUNCTION DEVICES

(71) Applicant: TAIWAN SEMICONDUCTOR MANUFACTURING CO., LTD., Hsinchu (TW)

(72) Inventors: Hsi-Wen Tien, Hsinchu County (TW); Wei-Hao Liao, Taichung (TW); Pin-Ren Dai, New Taipei (TW); Chih-Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 30 days.

(21) Appl. No.: 16/847,447

(22) Filed: Apr. 13, 2020

(65) Prior Publication Data

US 2020/0243754 A1 Jul. 30, 2020

Related U.S. Application Data

(62) Division of application No. 15/825,972, filed on Nov. 29, 2017, now Pat. No. 10,622,551.

(51) Int. Cl.
| | |
|---|---|
| *H01L 43/08* | (2006.01) |
| *H01L 27/22* | (2006.01) |
| *H01L 43/12* | (2006.01) |
| *G11C 11/16* | (2006.01) |
| *H01L 43/10* | (2006.01) |
| *H01L 43/02* | (2006.01) |
| *H01L 23/522* | (2006.01) |

(52) U.S. Cl.
CPC ............ *H01L 43/08* (2013.01); *G11C 11/161* (2013.01); *H01L 23/5226* (2013.01); *H01L 27/222* (2013.01); *H01L 27/228* (2013.01); *H01L 43/02* (2013.01); *H01L 43/10* (2013.01); *H01L 43/12* (2013.01)

(58) Field of Classification Search
CPC ......... H01L 43/08; H01L 43/02; H01L 43/10; H01L 43/12; H01L 23/5226; H01L 27/222; H01L 27/228; G11C 11/161
USPC .......................................................... 257/421
See application file for complete search history.

(56) References Cited

U.S. PATENT DOCUMENTS

| | | | |
|---|---|---|---|
| 9,847,481 B2 * | 12/2017 | Chang | ................. H01L 27/2436 |
| 2007/0012906 A1 | 1/2007 | Kim | |
| 2008/0073637 A1 | 3/2008 | Kuh | |
| 2008/0075844 A1 | 3/2008 | Ha et al. | |
| 2008/0247219 A1 | 10/2008 | Choi | |
| 2013/0267042 A1 * | 10/2013 | Satoh | .................... H01L 27/222 438/3 |
| 2015/0014800 A1 * | 1/2015 | Satoh | ...................... H01L 43/12 257/421 |
| 2016/0056376 A1 | 2/2016 | Horii et al. | |

(Continued)

*Primary Examiner* — Tu-Tu V Ho
(74) *Attorney, Agent, or Firm* — Maschoff Brennan

(57) ABSTRACT

A semiconductor device includes a semiconductor substrate, a bottom electrode, a magnetic tunneling junction (MTJ), a top electrode, and a residue. The bottom electrode is disposed over the semiconductor substrate. The MTJ is disposed over the bottom electrode. The top electrode is disposed over the MTJ layer. Sidewalls of the bottom electrode, the MTJ, and the top electrode are vertically aligned with each other. The residue of the MTJ is located on the sidewall of the bottom electrode.

20 Claims, 7 Drawing Sheets

(56) References Cited

U.S. PATENT DOCUMENTS

| | | |
|---|---|---|
| 2016/0268336 A1 | 9/2016 | Shun |
| 2017/0054070 A1 | 2/2017 | Bak et al. |
| 2017/0062581 A1 | 3/2017 | You |
| 2017/0069684 A1 | 3/2017 | Suh |
| 2017/0110649 A1 | 4/2017 | Diaz |
| 2017/0117467 A1 | 4/2017 | Chang |
| 2018/0040813 A1 | 2/2018 | Han et al. |
| 2018/0158867 A1 | 6/2018 | Kim |
| 2018/0159023 A1 | 6/2018 | Suh |
| 2018/0198062 A1 | 7/2018 | Bak |
| 2018/0205002 A1 | 7/2018 | Bak |
| 2018/0212140 A1 | 7/2018 | Noh |
| 2018/0233661 A1 | 8/2018 | Lin |
| 2019/0013353 A1 | 1/2019 | Lee |
| 2019/0027679 A1 | 1/2019 | Ouellette |
| 2019/0058109 A1 | 2/2019 | Chen |
| 2019/0067566 A1 | 2/2019 | Nagel |
| 2019/0088686 A1 | 3/2019 | Kim |

* cited by examiner

MAGNETIC TUNNEL JUNCTION DEVICES

PRIORITY CLAIM AND CROSS-REFERENCE

This application is a divisional application of U.S. application Ser. No. 15/825,972, filed on Nov. 29, 2017, now U.S. Pat. No. 10,622,551, issued on Apr. 14, 2020, the entirety of which is incorporated by reference herein.

BACKGROUND

Many modern day electronic devices contain an electronic memory. The Electronic memory may be a volatile memory or a non-volatile memory. The non-volatile memory is able to retain its stored data in the absence of power, whereas the volatile memory loses its data memory contents when power is lost. A magnetoresistive random-access memory (MRAM) is one of promising candidates for the next generation of non-volatile electronic memory due to advantages over conventional electronic memories. Compared to the conventional non-volatile memory, such as a flash random-access memory, the MRAM typically is faster and has better endurance. Compared to the conventional volatile memory, such as a dynamic random-access memory (DRAM) or a static random-access memory (SRAM), the MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
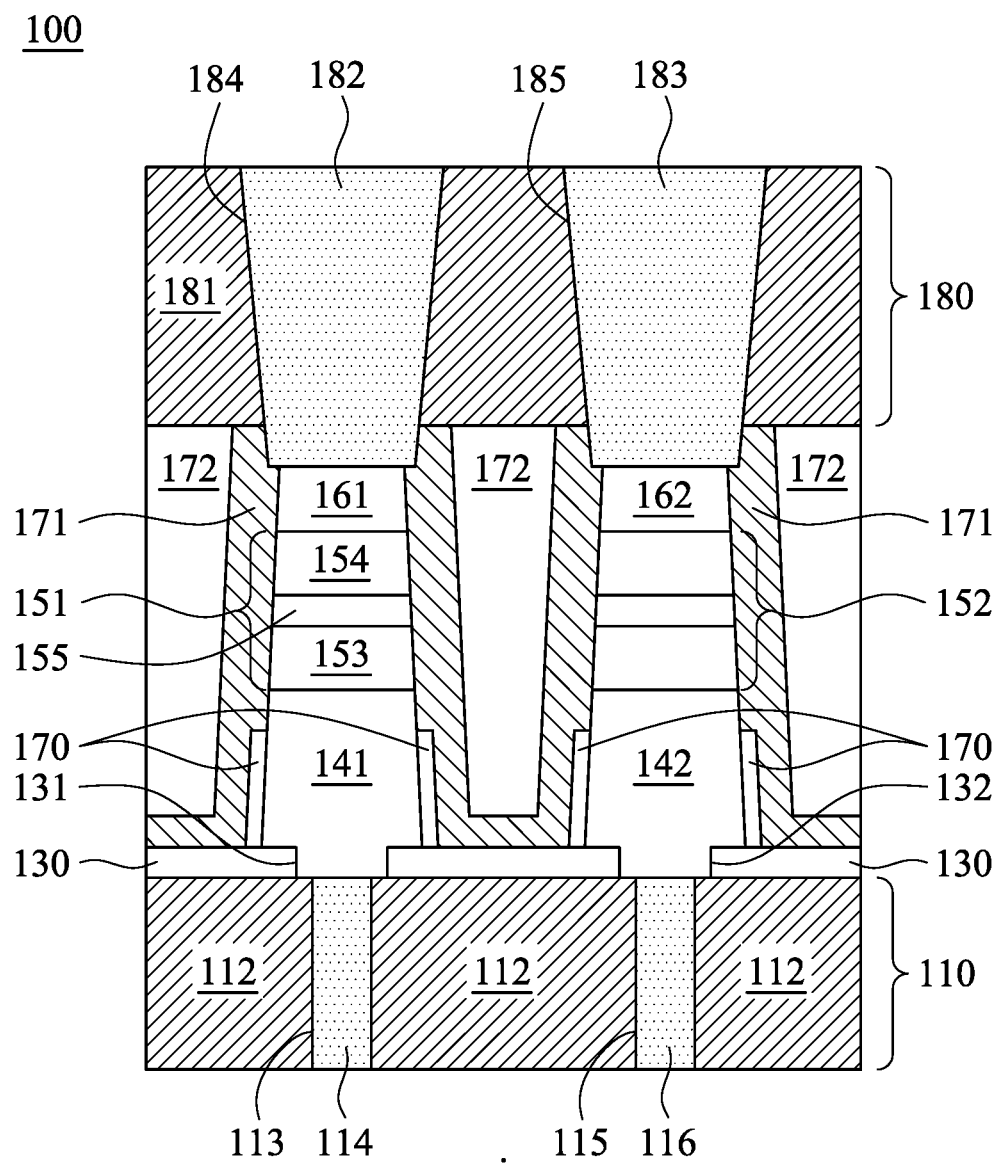
FIG. 1 is a schematic cross-sectional view of a semiconductor device in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over," "on," "around," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) cell includes top and bottom electrodes, and a magnetic tunnel junction (MTJ) arranged between the top and bottom electrodes. In conventional manufacturing methods, a bottom electrode layer, a MTJ layer, and a top electrode layer are sequentially formed. A first etch operation is performed to etch the top electrode layer and the MTJ layer to form the top electrode and the MTJ respectively. At this instance, a by-product is formed on the sidewall of the MTJ due to re-deposition and low volatility of the MTJ. Then, a cap layer is formed on the sidewalls of the top electrode and the MTJ. A spacer layer is formed over the cap layer and on a top surface of the bottom electrode layer. A second etch operation is performed to etch the bottom electrode layer and the spacer layer so that different bottom electrodes are electrically insulated from each other. If there is a pattern shifting, then the MTJ may be etched and damaged by the second etch operation. In the present disclosure, the top electrode, the MTJ and the bottom electrode are formed by a single etch operation. Therefore, the by-product is formed on the sidewall of the bottom electrode that leaves the sidewall of the MTJ clean. In addition, the second etch operation is omitted, and thus the MTJ will not be damaged.

Referring to FIG. 1, a cross-sectional view of a semiconductor device 100 in accordance with some embodiments is provided. The semiconductor device 100 includes a semiconductor substrate 102 which may be a bulk silicon substrate or a semiconductor-on-insulator (SOI) substrate (e.g., silicon on insulator substrate). The substrate 102 may also be a binary semiconductor substrate (e.g., GaAs), a tertiary semiconductor substrate (e.g., AlGaAs), or a higher order semiconductor substrate, for example. In many instances, the substrate 102 manifests as a semiconductor wafer, and may have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After, for example, after MRAM cells are formed a wafer, the wafer may optionally be stacked with another wafer or die, and is then singulated into individual die which correspond to individual ICs.

An interconnect structure 110 is disposed above the substrate 102. Additional components or layers may be disposed between the interconnect structure 110 and the substrate 102. The interconnect structure 110 includes a dielectric layer 112 and metal lines 114 and 116. The metal lines 114 and 116 are disposed in openings 113 and 115 respectively. In some embodiments, the dielectric layer 112 serves as an inter-metal dielectric (IMD). The dielectric layer 112 may be an oxide, such as silicon dioxide, a low-κ dielectric material, or an extreme low-κ dielectric material. The metal lines 114 and 116 may be made of a metal, such as aluminum, copper, or combinations thereof.

An etch stop layer 130 is disposed over the dielectric layer 112, and has openings 131 and 132 to expose the metal lines 114 and 116 respectively. In some embodiments, the etch stop layer 130 is made of metal oxide or dielectric film, and has a thickness in a range substantially from 30 Angstroms to 200 Angstroms. For example, the etch stop layer 130 may be made of AlOx, TiO, AlON, ZrO, SiC, $SiO_2$, SiOC, SiN, SiCN, SiON, or SiOCN.

Bottom electrodes 141 and 142 are formed on the etch stop layer 130. The bottom electrodes 141 and 142 are in direct contact with the metal lines 114 and 116 through the openings 131 and 132 respectively. In some embodiments, the bottom electrodes 141 and 142 are made of Ta, TaN, TiN, Cu, Co or W with a thickness ranging from about 10 Angstroms to about 1000 Angstroms. In some embodiments, the thickness of the bottom electrodes 141 and 142 are greater than 200 Angstroms.

Magnetic tunnel junctions (MTJ) 151 and 152 are disposed on the bottom electrodes 141 and 142 respectively. The MTJ 151 at least includes a lower ferromagnetic electrode 153 and an upper ferromagnetic electrode 154, which are separated from one another by a tunneling barrier layer 155. In some embodiments, the lower ferromagnetic electrode 153 may have a fixed or "pinned" magnetic orientation, while the upper ferromagnetic electrode 154 has a variable or "free" magnetic orientation, which may be switched between two or more distinct magnetic polarities that each represents a different data state, such as a different binary state. In other implementations, however, the MTJ 151 may be vertically "flipped", such that the lower ferromagnetic electrode 153 has a "free" magnetic orientation, while the upper ferromagnetic electrode 154 has a "pinned" magnetic orientation. In some embodiments, the upper ferromagnetic electrode 154 and the lower ferromagnetic electrode 153 include Fe, Co, Ni, Ru, FeCo, CoNi, CoFeB, FeB, FePt, FePd, or the like, and have thicknesses ranging from about 8 angstroms to about 13 angstroms. The tunneling barrier layer 155 provides electrical isolation between the upper ferromagnetic electrode 154 and the lower ferromagnetic electrode 153, while still allowing electrons to tunnel through the tunneling barrier layer 155 under proper conditions. The tunneling barrier layer 155 may include, for example, magnesium oxide (MgO), aluminum oxide (e.g., $Al_2O_3$), NiO, GdO, $Ta_2O_5$, $MoO_2$, $TiO_2$, $WO_2$, or the like. Further, the tunneling barrier layer 155 may be, for example, about 0.5-2 nanometers thick. The structure of the MTJ 152 is similar to that of the MTJ 151.

Top electrodes 161 and 162 are disposed on the MTJs 151 and 152 respectively. In some embodiments, the top electrodes 161 and 162 are made of Ta, TaN, Cu, Co or W with a thickness ranging from about 100 Angstroms to about 600 Angstroms. In some embodiments, the thickness of the top electrodes 161 and 162 are less than that of the bottom electrode 141 and 142.

Residues 170 of the MTJs 151 and 152 are located on the sidewalls of the bottom electrodes 141 and 142. In some embodiments, the residues 170 includes tantalum, titanium nitride, copper, cobalt, aluminum, zirconium, silicon, nitride, oxide or tungsten with a thickness ranging from about 0 Angstrom (i.e. no residue is generated) to about 50 Angstroms. The residues 170 are generated when etching the MTJs 151 and 152, but they are not located on the sidewalls of the MTJs 151 and 152. The etching operation that generates the residues 170 will be described below.

A cap layer 171 lines the sidewalls of the bottom electrode 141, the MTJ 151, the top electrode 161, the bottom electrode 142, the MTJ 152, and the top electrode 162. The cap layer 171 also lines a top surface of the etch stop layer 130. In some embodiments, the cap layer 171 includes SiN, SiCN, or $SiO_2$ with a thickness ranging from about 50 Angstroms to about 300 Angstroms.

A dielectric layer 172 is disposed on the cap layer 171 and laterally around the bottom electrodes 141 and 142, the MTJs 151 and 152, and the top electrodes 161 and 162. In some embodiments, the dielectric layer 172 includes SiCN, SiN, $SiO_2$, SiC, or SiOC with a thickness ranging from about 600 Angstroms to about 2000 Angstroms.

An interconnect structure 180 is disposed on the dielectric layer 171. The interconnect structure 180 includes a dielectric layer 181 and metal lines 182 and 183. The metal lines 182 and 183 are disposed in openings 184 and 185, and in contact with the top electrodes 161 and 162 respectively. In some embodiments, the dielectric layer 181 serves as an inter-metal dielectric (IMD). The dielectric layer 181 may be an oxide, such as silicon dioxide, a low-κ dielectric material, or an extreme low-κ dielectric material. The metal lines 182 and 183 may be made of a metal, such as aluminum, copper, or combinations thereof.

In FIG. 1, the sidewalls of the bottom electrode 141, the MTJ 151, and the top electrode 161 are vertically aligned with each other because they are formed by a single etch operation. Similarly, the sidewalls of the bottom electrode 142, the MTJ 152, and the top electrode 162 are vertically aligned with each other. In some embodiments, only the cap layer 171 is formed to protect the MRAM cells without additional spacer layers. A conventional second etch operation is omitted, and therefore the cap layer 171 is disposed on the etch stop layer 130 laterally between the bottom electrodes 141 and 142. The bottom electrodes 141 and 142 have sufficient heights to allow the residues 170 to be formed on the sidewalls of the bottom electrodes 141 and 142 instead of the sidewalls of the MTJs 151 and 152.

Figure 2:
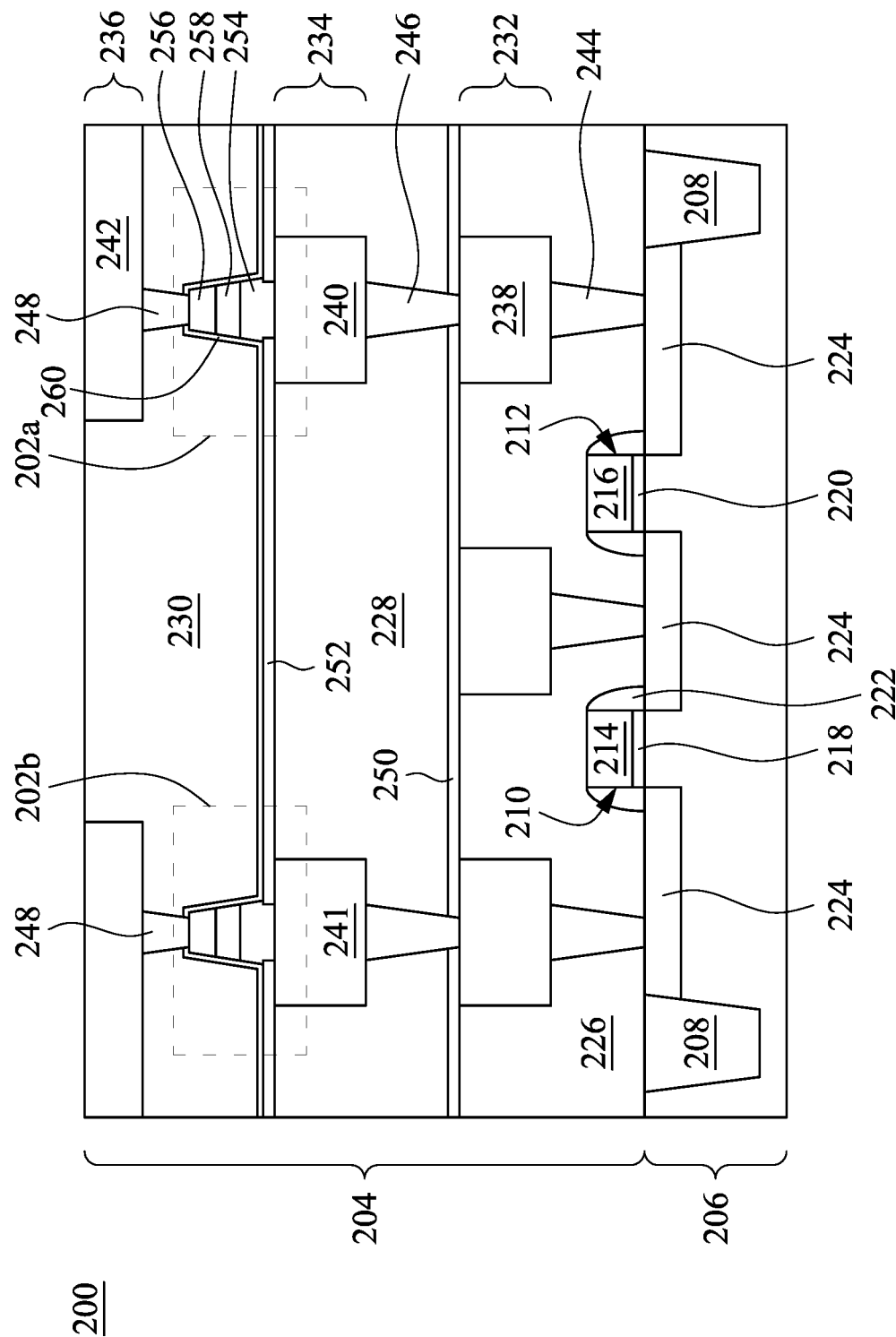
FIG. 2 is a schematic cross-sectional view of a semiconductor device which includes MRAM cells disposed in an interconnect structure in accordance with some embodiments.

FIG. 2 illustrates a cross sectional view of some embodiments of a semiconductor device 200, which includes MRAM cells 202a, 202b disposed in an interconnect structure 204 of the semiconductor device 200. The semiconductor device 200 includes a substrate 206. Two word line transistors 210, 212 are disposed between the shallow trench insolation (STI) regions 208. The word line transistors 210, 212 include word line gate electrodes 214, 216, respectively; word line gate dielectrics 218, 220, respectively; word line sidewall spacers 222; and source/drain regions 224. The source/drain regions 224 are disposed within the substrate 206 between the word line gate electrodes 214, 216 and the STI regions 208, and are doped to have a first conductivity type which is opposite a second conductivity type of a channel region under the gate dielectrics 218, 220, respectively. The word line gate electrodes 214, 216 may be, for example, doped polysilicon or a metal, such as aluminum, copper, or combinations thereof. The word line gate dielectrics 218, 220 may be, for example, an oxide, such as silicon dioxide, or a high-k dielectric material. The word line sidewall spacers 222 may be made of SiN, for example.

The interconnect structure 204 is arranged over the substrate 206 and couples devices (e.g., transistors 210, 212) to one another. The interconnect structure 204 includes IMD layers 226, 228, 230, and metallization layers 232, 234, 236 which are layered over one another in alternating fashion. The IMD layers 226, 228, 230 may be made, for example, of a low κ dielectric, such as un-doped silicate glass, or an oxide, such as silicon dioxide, or an extreme low x dielectric layer. The metallization layers 232, 234, 236 include metal lines 238, 240, 241, 242, which are formed within trenches, and which may be made of a metal, such as copper or aluminum. Contacts 244 extend from the bottom metallization layer 232 to the source/drain regions 224 and/or gate electrodes 214, 216; and vias 246, 248 extend between the metallization layers 232, 234, 236. The contacts 244 and the vias 246, 248 extend through dielectric-protection layers 250, 252 (which may be made of dielectric material and may act as etch stop layers during manufacturing). In some embodiments, one or more of the vias 246 and 248 are omitted (similar to the structure shown in FIG. 1). The dielectric-protection layers 250, 252 may be made of an extreme low-κ dielectric material, such as SiC, for example. The contacts 244 and the vias 246, 248 may be made of a metal, such as copper or tungsten, for example.

MRAM cells 202a, 202b, which are configured to store respective data states, are arranged within the interconnect structure 204 between neighboring metal layers. The MRAM cell 202a includes a bottom electrode 254 and a top electrode 256, which are made of conductive material. Between its top and bottom electrodes 254, 256, MRAM cell 202a includes an MTJ 258. MRAM cell 202a also includes a cap layer 260.

The MTJ 258 includes a lower ferromagnetic electrode (which may have a pinned magnetic orientation) and an upper ferromagnetic electrode (which may have a free magnetic orientation). A tunneling barrier layer is disposed between the lower and upper ferromagnetic electrodes. In operation, the variable magnetic polarity of the upper (e.g., free) ferromagnetic electrode is typically read by measuring the resistance of the MTJ 258. Due to the magnetic tunnel effect, the resistance of the MTJ 258 changes with the variable magnetic polarity. Further, in operation, the variable magnetic polarity is typically changed or toggled using the spin-transfer torque (STT) effect. According to the STT effect, current is passed across the MTJ 258 to induce a flow of electrons from the lower (e.g., pinned) ferromagnetic electrode to the upper (e.g., free) ferromagnetic electrode. As electrons pass through the lower ferromagnetic electrode, the spins of the electrons are polarized. When the spin-polarized electrons reach the upper ferromagnetic electrode, the spin-polarized electrons apply a torque to the variable magnetic polarity and toggle the state of the upper ferromagnetic electrode. Alternative approaches to reading or changing the variable magnetic polarity are also amenable. For example, in some alternate approaches magnetization polarities of the pinned and/or free ferromagnetic electrodes are perpendicular to an interface between the tunneling barrier layer and the pinned and/or free ferromagnetic electrode, making the MTJ 258 a perpendicular MTJ.

Figure 3A:
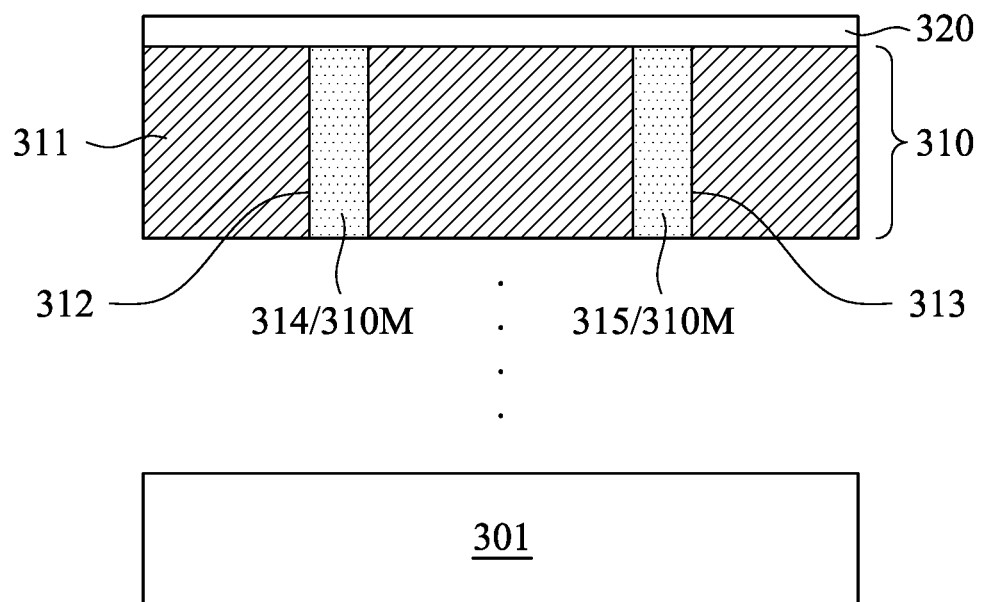
FIG. 3A to FIG. 3H are schematic cross-sectional views of intermediate stages showing a method for manufacturing a semiconductor device having MRAM cells in accordance with some embodiments.

FIG. 3A to FIG. 3H are cross-sectional views at various stages for manufacturing a semiconductor device having MRAM cells in accordance with some embodiments. Referring to FIG. 3A, a semiconductor substrate 301 is provided. The semiconductor substrate 301 may be a semiconductor wafer such as a silicon wafer. Alternatively or additionally, the substrate 301 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

A dielectric layer 311 is formed over the semiconductor substrate 301. Note that other components or layers may be disposed between the dielectric layer 311 and the semiconductor substrate 301. Openings 312 and 313 are formed in the dielectric layer 311. The openings 312 and 313 are filled with a metal layer 310M to establish metal lines 314 and 315. The dielectric layer 311 and the metal lines 314 and 315 constitute an interconnect structure 310. The dielectric layer 311 may include multilayers made of multiple dielectric materials, such as a low dielectric constant or an extreme low dielectric constant (ELK) material. In some embodiments, the first dielectric layer 311 is made of low-k dielectric materials. In some embodiments, the first dielectric layer 311 is made of silicon oxide, silicon nitride, silicon oxynitride, phosphosilicate glass (PSG), borophosphosilicate glass (BPSG), and/or other applicable low-k dielectric materials. The metal layer 310M may include copper, aluminum, tungsten, titanium, tantulum, titanium nitride, tantalum nitride, nickel silicide, cobalt silicide, TaC, TaSiN, TaCN, TiAl, TiAlN, or other applicable materials. The dielectric layer 311 and/or the metal layer 310M are formed by performing a chemical vapor deposition (CVD) process, a physical vapor deposition (PVD) process, an atomic layer deposition (ALD) process, a spin-on coating process, or other applicable processes. The etch process for forming the openings 312 and 313 may be any applicable wet etching or dry etching.

An etch stop layer 320 is formed over the interconnect structure 310. In some embodiments, the etch stop layer 320 includes metal oxide such as AlOx, TiO, AlON, or ZrO. In some embodiments, the etch stop layer includes dielectric film such as SiC, $SiO_2$, SiOC, SiN, SiCN, SiON, or SiOCN. The thickness of the etch stop layer 320 is in a range from about 30 Angstroms to about 200 Angstroms. The etch stop layer 320 may be formed by performing a chemical vapor deposition (CVD) process, a physical vapor deposition (PVD) process, an atomic layer deposition (ALD) process, a spin-on coating process, or other applicable processes.

Figure 3B:
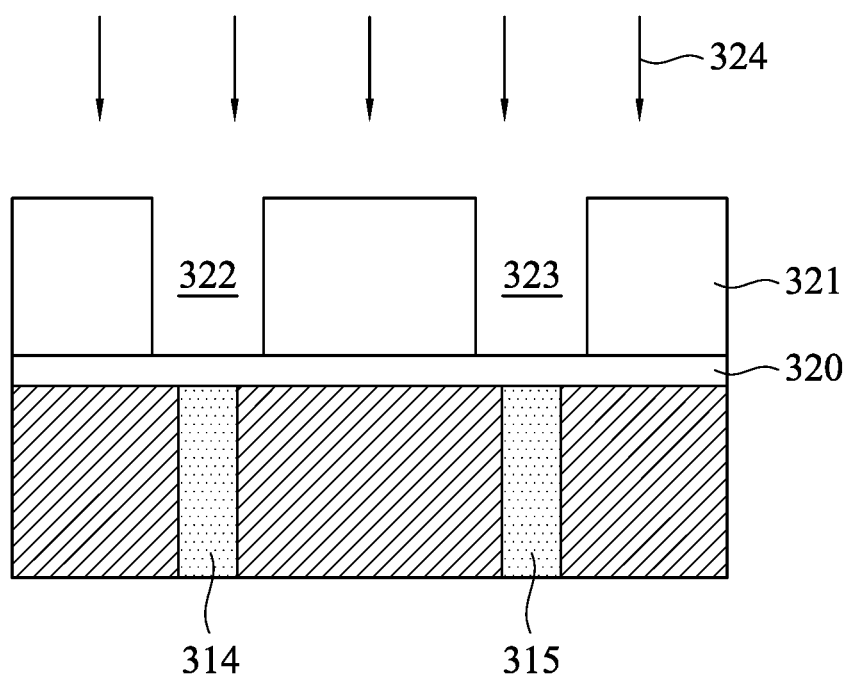

In the following FIG. 3B to FIG. 3H, the semiconductor substrate 301 is not shown for simplification. Referring to FIG. 3B, a photoresist layer 321 is formed over the etch stop layer 320. As shown in FIG. 3B, the photoresist layer 321 has openings 322 and 323 corresponding to metal lines 314 and 315 respectively. Afterwards, the etch stop layer 320 is etched through the openings 322 and 323 by performing an etch operation 324. The etch operation 324 may be a reactive-ion etching using an inductively coupled plasma (ICP) source or a capacitively coupled plasma (CCP) source with etch gases of $CH_4$, $CH_3F$, $CH_2F_2$, $CHF_3$, $C_4F_8$, $C_4F_6$, $CF_4$, $H_2$, HBr, CO, COS, $O_2$, $Cl_2$, $N_2$, He, Ne, Ar, etc.; with pressure of 0.5-120 mT; with temperature of 10 to 100° C.; with power of 50 to 3000 watts and bias of 0 to 1200 volts.

Figure 3C:
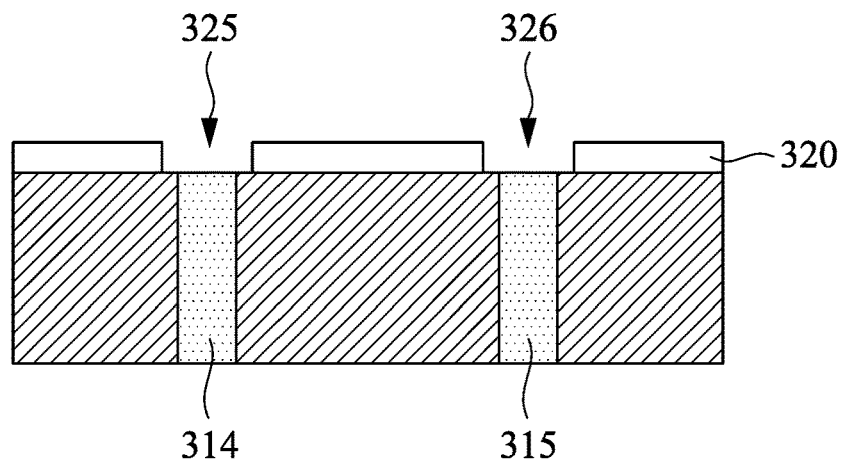

Referring to FIG. 3C, after the etch operation 324 is performed, openings 325 and 326 are formed in the etch stop layer 320. The opening 325 exposes at least a portion of the metal line 314, and the opening 326 exposes at least a portion of the metal line 315.

Figure 3D:
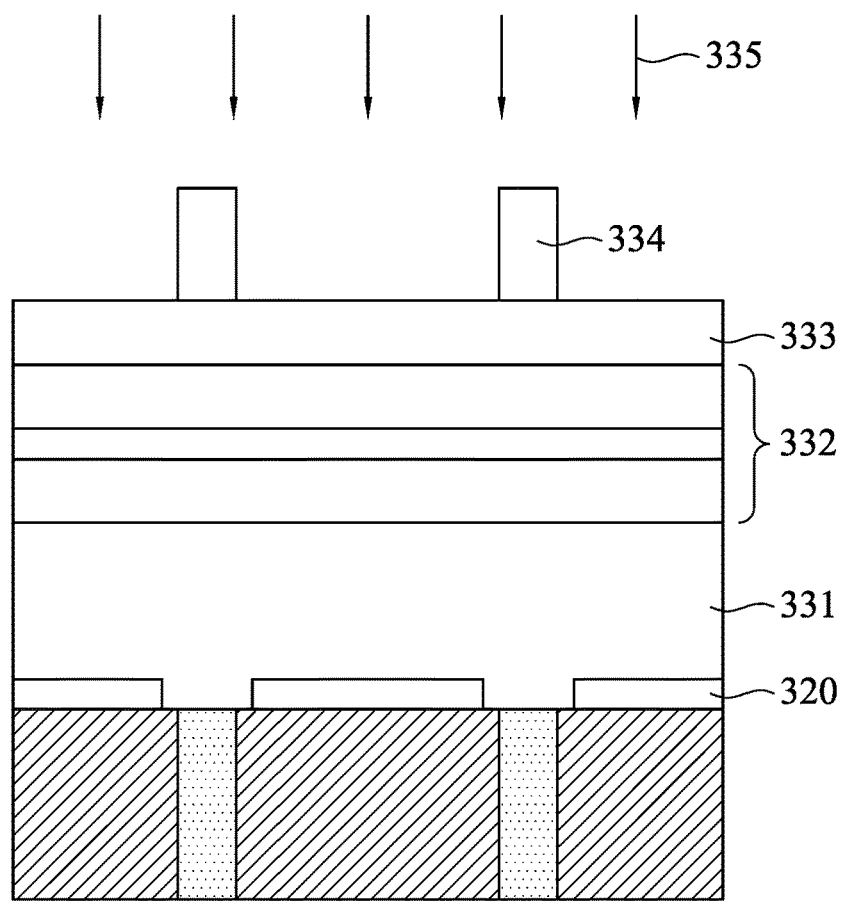

Referring to FIG. 3D, a bottom electrode layer 331, a magnetic tunneling junction (MTJ) layer 332 and a top electrode layer 333 are sequentially formed on the etch stop layer. The bottom electrode layer 331 may include Ta, TaN, TiN, Cu, Co or W with a thickness ranging from about 10 Angstroms to about 1000 Angstroms. The MTJ layer 332 at least includes a lower ferromagnetic electrode layer and an upper ferromagnetic electrode layer, which are separated from one another by a tunneling barrier layer. In some embodiments, the lower ferromagnetic electrode layer may have a fixed or "pinned" magnetic orientation, while the upper ferromagnetic electrode layer has a variable or "free" magnetic orientation, which may be switched between two or more distinct magnetic polarities that each represents a different data state, such as a different binary state. In other implementations, however, the MTJ layer 332 may be vertically "flipped", such that the lower ferromagnetic electrode layer has a "free" magnetic orientation, while the upper ferromagnetic electrode layer has a "pinned" magnetic orientation. In some embodiments, the upper ferromagnetic electrode layer and the lower ferromagnetic electrode layer include Fe, Co, Ni, Ru, FeCo, CoNi, CoFeB, FeB, FePt, FePd, or the like, and have thicknesses ranging from about 8 angstroms to about 13 angstroms. The tunneling barrier layer provides electrical isolation between the upper ferromagnetic electrode layer and the lower ferromagnetic electrode layer, while still allowing electrons to tunnel through the tunneling barrier layer under proper conditions. The tunneling barrier layer may comprise, for example, magnesium oxide (MgO), aluminum oxide (e.g., $Al_2O_3$), NiO, GdO, $Ta_2O_5$, $MoO_2$, $TiO_2$, $WO_2$, or the like. Further, the tunneling barrier layer may be, for example, about 0.5-2 nanometers thick. The top electrode layer 333 includes Ta, TaN, Cu, Co or W with a thickness ranging from about 100 Angstroms to about 600 Angstroms. In some embodiments, the thickness of the top electrodes layer 333 is less than that of the bottom electrode layer 331. The bottom electrode 331, the MTJ layer 332 and the top electrode layer 333 are formed by performing chemical vapor deposition (CVD) processes, physical vapor deposition (PVD) processes, atomic layer deposition (ALD) processes, spin-on coating processes, or other applicable processes. Afterwards, a photoresist layer 334 is formed on the top electrode layer 333.

An etch operation 335 is performed for etching the bottom electrode 331, the MTJ layer 332 and the top electrode layer 333. In some embodiments, the etch operation 335 is an ion beam etching (IBE) with etch gases of He, Ne, Ar, Kr or Xe; with etch angle of 0 to 70 degrees; and with power of 50 to 3000 watts. In some embodiments, the etch operation 334 is an RIE etching (using ICP or CCP source) with etch gases of $CH_3OG$, $C_2H_5OH$, $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, etc.; with pressure of 0.5 to 100 mT; with temperature of 15 to 120° C.; and with power of 150 to 3000 watts and bias of 0 to 2000 volts.

Figure 3E:
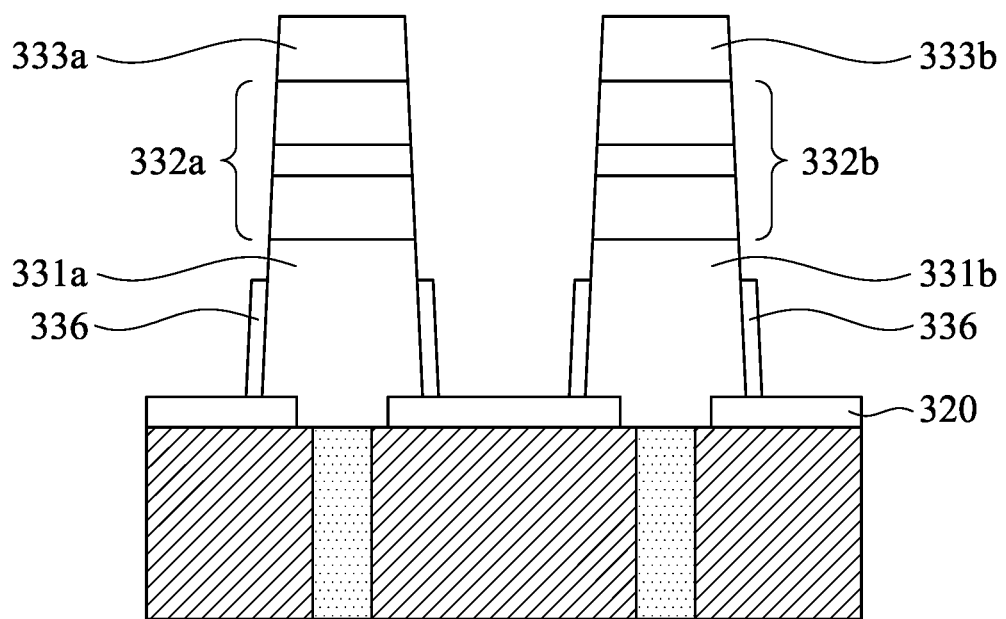

Referring to FIG. 3E, after the etch operation 335 is performed, bottom electrodes 331a, 331b, MTJs 332a, 332b, and top electrodes 333a, 333b are formed. The bottom electrodes 331a and 331b are in direct contact with the metal lines 314 and 315 respectively. A portion of the etch stop layer 320 laterally located between the bottom electrodes 331a and 331b is exposed, and therefore the bottom electrodes 331 and 331b are electrically insulated from the ach other. Residues 336 are by-products generated on the sidewalls of the bottom electrodes 331a and 331b during the etch operation 335. In some embodiments, the residues 336 include tantalum, titanium nitride, copper, cobalt, aluminum, zirconium, silicon, nitride, oxide or tungsten with a thickness ranging from about 0 Angstrom (i.e. no residue is generated) to about 50 Angstroms. The residues 336 are not generated on the sidewalls of the MTJs 332a and 332b because the bottom electrodes 331a and 331b have sufficient heights (e.g. heights of more than 100 Angstroms) and because the MTJs 331a, 332b and the bottom electrodes 331a, 331b are formed by the same etch operation. Accordingly, the performance of the MTJs 332a and 332b are not affected by the residues 336.

Figure 3F:
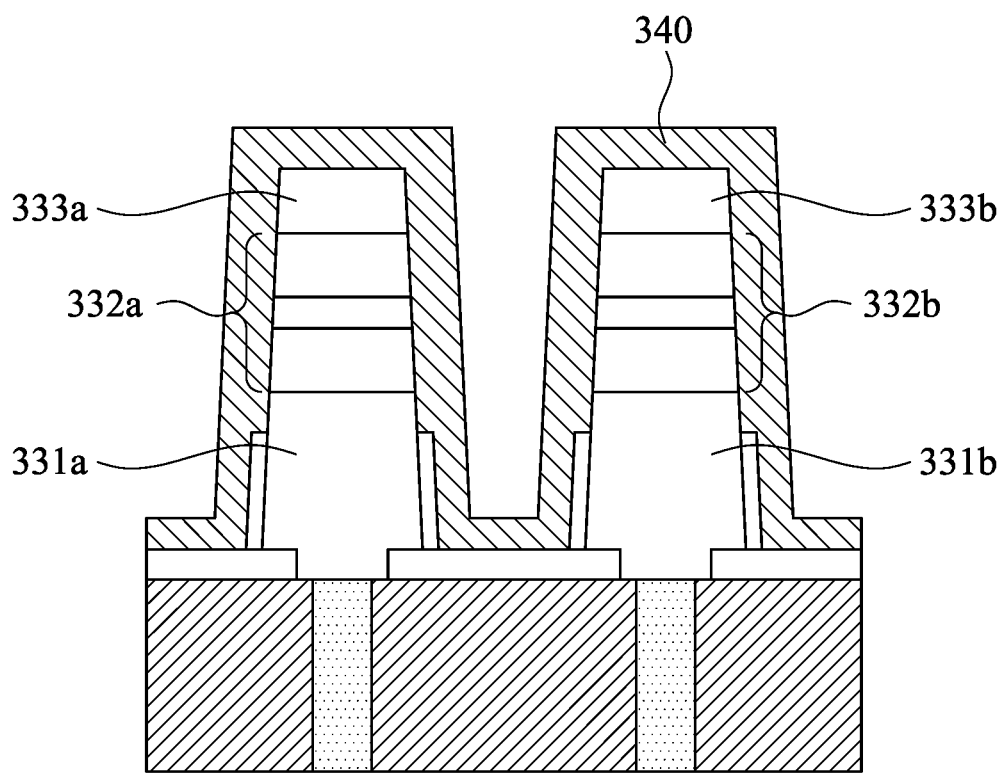

Referring to FIG. 3F, a cap layer 340 is formed lining the sidewalls of the bottom electrodes 331a and 331b, the sidewalls of the MTJs 332a and 332b, the sidewalls and the top surfaces of the top electrodes 333a and 333, and the top surface of the etch stop layer 320. In some embodiments, the cap layer 340 includes silicon nitride, silicon carbon nitride or silicon dioxide with a thickness ranging from about 50 angstroms to about 300 angstroms. The cap layer 340 is formed by performing a chemical vapor deposition (CVD) process, a physical vapor deposition (PVD) process, an atomic layer deposition (ALD) process, a spin-on coating process, or other applicable processes.

Figure 3G:
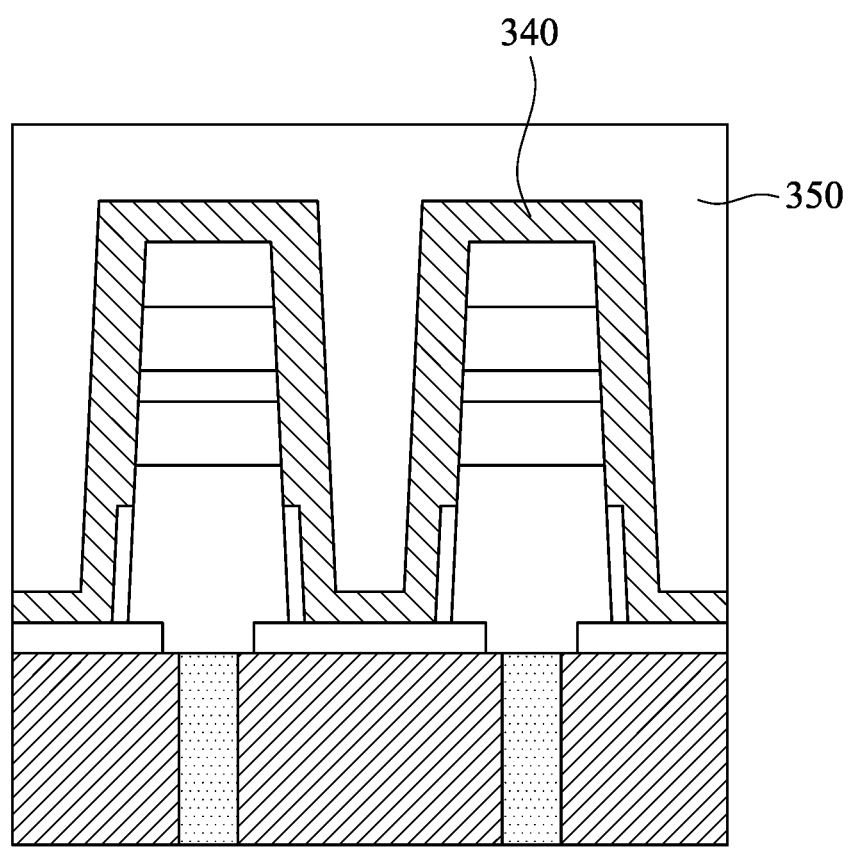

Referring to FIG. 3G, a dielectric layer 350 is formed over the cap layer 340. The dielectric layer 350 includes SiCN, SiN, $SiO_2$, SiC, or SiOC with a thickness ranging from about 600 Angstroms to about 2000 Angstroms. The dielectric layer 350 is formed by performing a chemical vapor deposition (CVD) process, a physical vapor deposition (PVD) process, an atomic layer deposition (ALD) process, a spin-on coating process, or other applicable processes.

In some embodiments, a removal operation, such as etch back or a chemical mechanical polish (CMP), is performed, until the top surfaces of the cap layer 340 are exposed. However, this removal operation may not be performed in some embodiments.

Figure 3H:
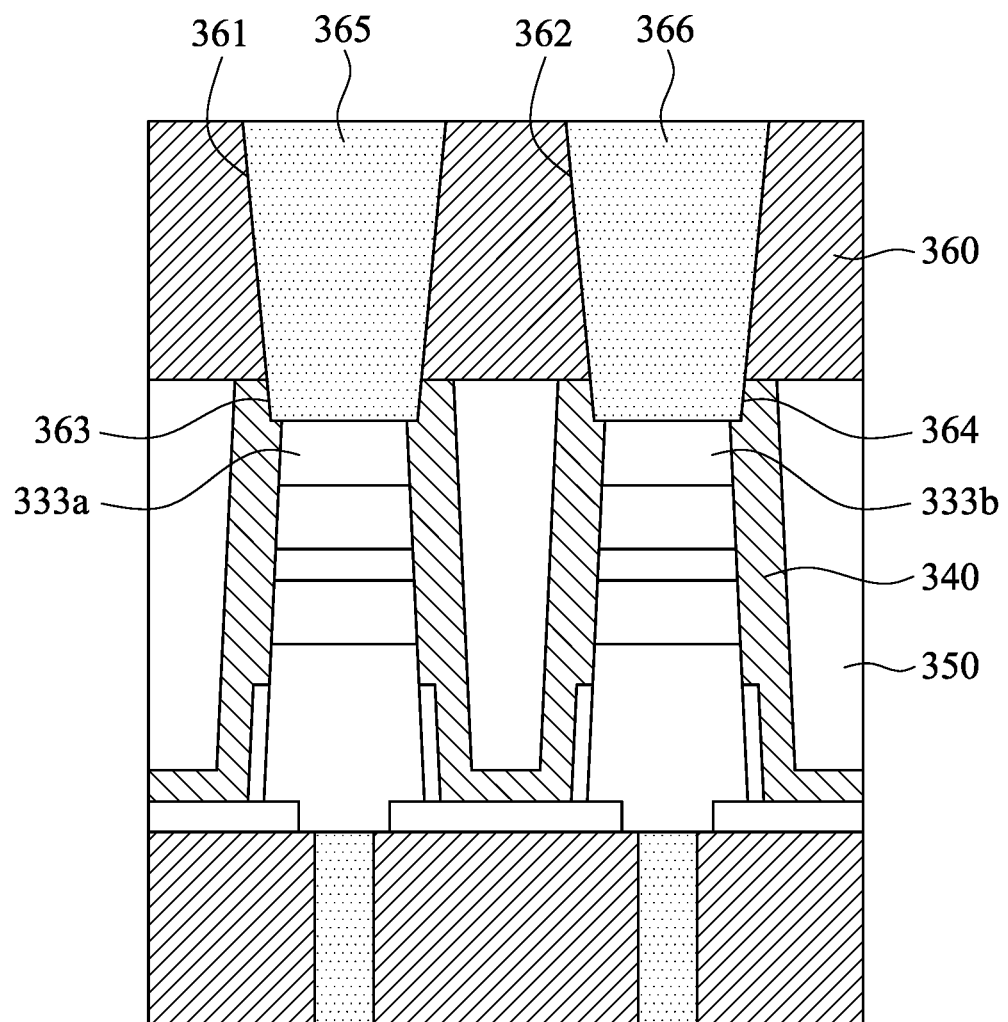

Referring to FIG. 3H, a dielectric layer 360 is formed over the dielectric layer 350. An etch operation is performed to form openings 361 and 362 in the dielectric layer 360 and openings 363 and 364 in the cap layer 340. Metal lines 365 and 366 are formed in the openings 361-364. The metal line 365 is in direct contact with the top electrode 333a, and the metal line 366 is in direct contact with the top electrode 333b. In some embodiments, the dielectric layer 360 is made of low-k dielectric materials. In some embodiments, the first dielectric layer 360 is made of silicon oxide, silicon nitride, silicon oxynitride, phosphosilicate glass (PSG), borophosphosilicate glass (BPSG), and/or other applicable low-k dielectric materials. The metal lines 365 and 366 may include aluminum, copper, tungsten, titanium, tantalum, titanium nitride, tantalum nitride, nickel silicide, cobalt silicide, TaC, TaSiN, TaCN, TiAl, TiAlN, or other applicable materials.

In accordance with some embodiments, a method for forming a semiconductor device is provided. The method includes: providing a semiconductor substrate; forming a bottom electrode layer over the semiconductor substrate; forming a magnetic tunneling junction (MTJ) layer over the bottom electrode layer; forming a top electrode layer over the MTJ layer; and performing a first etch operation for etching the bottom electrode layer, the MTJ layer, and the top electrode layer to form a bottom electrode, a MTJ, and a top electrode respectively.

In accordance with some embodiments, before forming the bottom electrode layer, the method further includes: forming a first dielectric layer over the semiconductor substrate; forming an opening in the first dielectric layer, and filling the opening of the first dielectric layer with a first metal layer to establish a first metal line; forming an etch stop layer over the dielectric layer; and etching the etch stop layer to form an opening in the etch stop layer that exposes a portion of the first metal line, in which the bottom electrode is disposed over the etch stop layer and in contact with the first metal line.

In accordance with some embodiments, the etch stop layer includes metal oxide or a dielectric film, and a thickness of the etch stop layer is in a range substantially from 30 to 200 angstroms.

In accordance with some embodiments, performing the first etch operation includes: etching the bottom electrode layer, the MTJ layer, and the top electrode layer to expose a portion of the etch stop layer.

In accordance with some embodiments, the method further includes: forming a cap layer which lines sidewalls of the bottom electrode, the MTJ, and the top electrode, and lines top surfaces of the top electrode and the etch stop layer.

In accordance with some embodiments, the cap layer includes silicon nitride, silicon carbon nitride or silicon dioxide, and a thickness of the cap layer is in a range substantially from 50 angstroms to 300 angstroms.

In accordance with some embodiments, method further includes: forming a second dielectric layer over the cap layer; forming a third dielectric layer over the second dielectric layer; etching the cap layer, the second dielectric layer, and the third dielectric layer to expose a portion of the top electrode; and forming a second metal layer in the opening of the third dielectric layer to establish a second metal line, in which the second metal line is in contact with the top electrode.

In accordance with some embodiments, a method for forming a semiconductor device is provided. The method includes: providing a semiconductor substrate; forming a bottom electrode layer over the semiconductor substrate; forming a magnetic tunneling junction (MTJ) layer over the bottom electrode layer; forming a top electrode layer over the MTJ layer; and performing a first etch operation for etching the bottom electrode layer, the MTJ layer, and the top electrode layer to form a first bottom electrode and a second bottom electrode corresponding to the bottom electrode layer, a first MTJ and a second MTJ corresponding to the MTJ layer, and a first top electrode and a second top electrode corresponding to the top electrode layer, i the first bottom electrode and the second bottom electrode are electrically insulated from each other.

In accordance with some embodiments, before forming the bottom electrode layer, the method further includes: forming a first dielectric layer over the semiconductor substrate; forming an first opening and a second opening in the first dielectric layer, and filling the first opening and the second opening of the first dielectric layer with a first metal layer to establish a first metal line and a second metal line; forming an etch stop layer over the dielectric layer; and etching the etch stop layer to form an first opening and a second opening in the etch stop layer that expose a portion of the first metal line and a portion of the second metal line respectively, in which the first bottom electrode is in contact with the first metal line, and the second bottom electrode is in contact with the second metal line.

In accordance with some embodiments, the etch stop layer includes metal oxide or a dielectric film, and a thickness of the etch stop layer is in a range substantially from 30 angstroms to 200 angstroms.

In accordance with some embodiments, performing the first etch operation includes: etching the bottom electrode layer, the MTJ layer, and the top electrode layer to expose a portion of the etch stop layer laterally located between the first bottom electrode and the second bottom electrode.

In accordance with some embodiments, the method further includes: forming a cap layer which lines sidewalls of the first bottom electrode, the second bottom electrode, the first MTJ, the second MTJ, the first top electrode, and the second top electrode, and lines top surfaces of the first top electrode, the second top electrode, and the etch stop layer.

In accordance with some embodiments, the cap layer includes silicon nitride, silicon carbon nitride or silicon dioxide, and a thickness of the cap layer is in a range substantially from 50 angstroms to 300 angstroms.

In accordance with some embodiments, a semiconductor device is provided. The semiconductor device includes a semiconductor substrate. A bottom electrode is disposed over the semiconductor substrate. A magnetic tunneling junction (MTJ) is disposed over the bottom electrode layer. A top electrode is disposed over the MTJ layer. The sidewalls of the bottom electrode, the MTJ, and the top electrode are vertically aligned with each other.

In accordance with some embodiments, the semiconductor device further includes a residue of the MTJ located on the sidewall of the bottom electrode, in which the residue includes tantalum, titanium nitride, copper, cobalt, aluminum, zirconium, silicon, nitride, oxide or tungsten.

In accordance with some embodiments, the semiconductor device further includes a first dielectric layer disposed over the semiconductor substrate and having an opening; a first metal line disposed in the opening of the first dielectric layer; and an etch stop layer disposed over the dielectric layer and having an opening to expose a portion of the first metal line. The bottom electrode is disposed over the etch stop layer and in contact with the first metal line.

In accordance with some embodiments, the etch stop layer includes metal oxide or a dielectric film, and a thickness of the etch stop layer is in a range substantially from 30 angstroms to 200 angstroms.

In accordance with some embodiments, the semiconductor device further includes a cap layer that lines sidewalls of the bottom electrode, the MTJ, and the top electrode, and lining a top surface of the etch stop layer.

In accordance with some embodiments, the cap layer includes silicon nitride, silicon carbon nitride or silicon dioxide, and a thickness of the cap layer is in a range substantially from 50 angstroms to 300 angstroms.

In accordance with some embodiments, the cap layer has an opening, and the semiconductor device further includes a second dielectric layer disposed laterally around the bottom electrode, the MTJ, and the top electrode; a third dielectric layer disposed over the second dielectric layer and having an opening; and a second metal line disposed in the opening of the third dielectric layer and in contact with the top electrode through the opening of the cap layer.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various modifications are possible within the scope of the disclosure, as those skilled in the relevant art will recognize.

What is claimed is:

1. A semiconductor device, comprising:
a semiconductor substrate;
a bottom electrode disposed over the semiconductor substrate;
a magnetic tunneling junction (MTJ) disposed over the bottom electrode;
a top electrode disposed over the MTJ, wherein sidewalls of the bottom electrode, the MTJ, and the top electrode are vertically aligned with each other; and
a residue of the MTJ located on the sidewall of the bottom electrode, and a top surface of the residue is lower than a top surface of the bottom electrode.

2. The semiconductor device of claim 1, wherein the residue comprises tantalum, titanium nitride, copper, cobalt, aluminum, zirconium, silicon, nitride, oxide or tungsten.

3. The semiconductor device of claim 1, further comprising:
- a first dielectric layer disposed over the semiconductor substrate;
- a first conductive line embedded in the first dielectric layer; and
- an etch stop layer disposed over the first dielectric layer, wherein the bottom electrode is disposed over the etch stop layer and in contact with the first conductive line.

4. The semiconductor device of claim 3, wherein the etch stop layer comprises metal oxide or dielectric film.

5. The semiconductor device of claim 3, wherein a thickness of the etch stop layer is in a range substantially from 30 angstroms to 200 angstroms.

6. The semiconductor device of claim 3, further comprising:
- a cap layer that lines sidewalls of the bottom electrode, the MTJ, and the top electrode, and lining a top surface of the etch stop layer.

7. The semiconductor device of claim 6, wherein the cap layer comprises silicon nitride, silicon carbon nitride or silicon dioxides.

8. The semiconductor device of claim 7, wherein a thickness of the cap layer is in a range substantially from 50 angstroms to 300 angstrom.

9. The semiconductor device of claim 6, further comprising:
- a second dielectric layer disposed laterally around the bottom electrode, the MTJ, and the top electrode;
- a third dielectric layer disposed over the second dielectric layer; and
- a second conductive line disposed in the third dielectric layer and extending through the cap layer and in contact with the top electrode.

10. The semiconductor device of claim 1, wherein a bottom surface of the residue is higher than a bottom surface of the bottom electrode.

11. The semiconductor device of claim 1, wherein the residue is spaced apart from the MTJ.

12. A semiconductor device, comprising:
- a first dielectric layer above a semiconductor substrate;
- a bottom conductive line in the first dielectric layer;
- a bottom electrode in contact with the bottom conductive line;
- a magnetic tunneling junction (MTJ) above the bottom electrode, wherein sidewalls of the bottom electrode and the MTJ are coterminous;
- a cap layer lining the sidewalls of the bottom electrode and the MTJ, wherein a bottommost surface of the cap layer is above a bottommost surface of the bottom electrode;
- a second dielectric layer laterally surrounding the cap layer; and
- a third dielectric layer above the second dielectric layer and the cap layer, wherein a top surface of the cap layer is in contact with the third dielectric layer.

13. The semiconductor device of claim 12, wherein the bottom electrode is a single piece of continuous material.

14. The semiconductor device of claim 12, wherein the bottom electrode comprises:
- a top portion, wherein the bottommost surface of the top portion is substantially level with the bottommost surface of the cap layer; and
- a bottom portion narrower than the top portion and between the top portion and the bottom conductive line.

15. The semiconductor device of claim 12, wherein a top surface of the bottom conductive line is lower than the bottommost surface of the cap layer.

16. The semiconductor device of claim 12, further comprising a top conductive line partially in the third dielectric layer and above the MTJ, wherein the top conductive line is spaced apart from the second dielectric layer.

17. A semiconductor device, comprising:
- a conductive line above a semiconductor substrate;
- a dielectric layer laterally surrounding the conductive line;
- an etch stop layer above the dielectric layer;
- a bottom electrode above the conductive line and in contact with the etch stop layer;
- a magnetic tunneling junction (MTJ) above the bottom electrode and spaced apart from the etch stop layer; and
- a residue of the MTJ on a sidewall of the bottom electrode.

18. The semiconductor device of claim 17, wherein the residue of the MTJ is spaced apart from the MTJ.

19. The semiconductor device of claim 17, further comprising a cap layer covering the MTJ and the bottom electrode, wherein the cap layer is in contact with the etch stop layer.

20. The semiconductor device of claim 19, wherein the cap layer is spaced apart from the dielectric layer.

* * * * *